United States Patent
Hao

(10) Patent No.: US 10,909,893 B2
(45) Date of Patent: Feb. 2, 2021

(54) SHIFT REGISTER CIRCUIT, GOA CIRCUIT, DISPLAY DEVICE AND METHOD FOR DRIVING THE SAME

(71) Applicant: BOE TECHNOLOGY GROUP CO., LTD., Beijing (CN)

(72) Inventor: Xueguang Hao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 203 days.

(21) Appl. No.: 15/776,881

(22) PCT Filed: Oct. 23, 2017

(86) PCT No.: PCT/CN2017/107338
§ 371 (c)(1),
(2) Date: May 17, 2018

(87) PCT Pub. No.: WO2018/133468
PCT Pub. Date: Jul. 26, 2018

(65) Prior Publication Data
US 2020/0193886 A1 Jun. 18, 2020

(30) Foreign Application Priority Data
Jan. 22, 2017 (CN) ..................... 2017 2 0080616 U

(51) Int. Cl.
*G09G 3/20* (2006.01)
*G06F 3/041* (2006.01)
*G11C 19/28* (2006.01)

(52) U.S. Cl.
CPC ............. *G09G 3/20* (2013.01); *G06F 3/0416* (2013.01); *G11C 19/28* (2013.01); *G09G 2300/0408* (2013.01); *G09G 2310/0286* (2013.01)

(58) Field of Classification Search
CPC ....... G09G 2310/0286; G09G 2310/00; G09G 2310/02
See application file for complete search history.

(56) References Cited

U.S. PATENT DOCUMENTS 9,824,659 B2 11/2017 Gu et al.
9,958,985 B2 5/2018 Lin et al.
(Continued)

FOREIGN PATENT DOCUMENTS

CN 105047168 A 11/2015
CN 105374314 A 3/2016
(Continued)

OTHER PUBLICATIONS

English translation of International Search Report and English translation of Box V of Written Opinion, for International Application No. PCT/CN2017/107338, dated Jan. 22, 2018, 14 pages.
(Continued)

*Primary Examiner* — Ram A Mistry
(74) *Attorney, Agent, or Firm* — Westman, Champlin & Koehler, P.A.

(57) ABSTRACT

The present disclosure provides a shift register circuit, a GOA circuit and a display device. The shift register circuit includes a shift register sub-circuit. The shift register sub-circuit includes a pull-up node, a pull-down node and a touch potential control circuit. The touch potential control circuit is coupled to a touch potential control terminal, an output terminal of the shift register sub-circuit, the pull-up node, the pull-down node and a low level output terminal, respectively. The touch potential control circuit is configured to, under control of the touch potential control terminal in a touch phase, control each of the output terminal of the shift register sub-circuit, the pull-up node and the pull-down node to be coupled to the low level output terminal.

17 Claims, 3 Drawing Sheets

(56) References Cited

U.S. PATENT DOCUMENTS

| | | |
|---|---|---|
| 2015/0269897 A1 | 9/2015 | Kitsomboonloha et al. |
| 2016/0155409 A1 | 6/2016 | Jeoung et al. |
| 2016/0189586 A1* | 6/2016 | Zou ..................... G09G 3/3266 345/213 |
| 2017/0123556 A1* | 5/2017 | Lin ....................... G06F 3/0412 |
| 2017/0221441 A1 | 8/2017 | Gu et al. |
| 2018/0046311 A1 | 2/2018 | Gu et al. |
| 2018/0108291 A1 | 4/2018 | Hao et al. |

FOREIGN PATENT DOCUMENTS

| | | |
|---|---|---|
| CN | 105590608 A | 5/2016 |
| CN | 105679262 A | 6/2016 |
| CN | 106128347 A | 11/2016 |
| CN | 206388486 U | 8/2017 |
| KR | 20140086192 A | 7/2014 |

OTHER PUBLICATIONS

Indian Action, including Search Report, for Indian Application No. 201817036125, dated Jul. 3, 2020, 6 pages.

Preliminary European search report for European Patent Application No. 17893418.8 dated Jul. 1, 2020, 17 pages.

\* cited by examiner

SHIFT REGISTER CIRCUIT, GOA CIRCUIT, DISPLAY DEVICE AND METHOD FOR DRIVING THE SAME

CROSS-REFERENCE TO RELATED APPLICATION

This application is the U.S. national phase of PCT Application No. PCT/CN2017/107338 filed on Oct. 23, 2017, which is based on and claims the priority of the Chinese patent application No. 201720080616.3 filed on Jan. 22, 2017, which is incorporated herein by reference in its entirety.

TECHNICAL FIELD

The present disclosure relates to the field of display driving technology, and in particular to a shift register circuit, a GOA circuit, a display device and a method for driving the same.

BACKGROUND

Liquid crystal display screens integrated with touch function for mobile phones and tablet computers have become a popular design for small and medium-sized panels. However, gate driver circuits of the small and medium-sized liquid crystal display screens are usually in form of Gate on array (GOA), i.e., a gate driver circuit on an array substrate, and implementation of the touch function may be seriously affected if the GOA circuit outputs a gate driving signal in a touch phase, which may reduce the touch sensitivity and even lead to failure of the touch function.

SUMMARY

One main object of the present disclosure is to provide a shift register circuit, a GOA circuit and a display device, which can solve problems in the related art that a signal from a gate signal output terminal is usually forced to be pull-down in a touch phase while a GOA circuit is still in a working state, which increases an overall power consumption of the GOA circuit and a display panel including the GOA circuit.

In order to achieve the above object, one embodiment of the present disclosure provides a shift register circuit includes a shift register sub-circuit with an output terminal coupled to a gate driving signal line. The shift register sub-circuit includes a pull-up node, a pull-down node, a pull-up node control circuit, a pull-down node control circuit and an output circuit. The pull-up node control circuit is coupled to the pull-up node; the pull-down node control circuit is coupled to the pull-up node and the pull-down node, respectively; and the output circuit is coupled to the pull-up node, the pull-down node and the output terminal of the shift register sub-circuit, respectively. The shift register circuit further includes a touch potential control circuit; and the touch potential control circuit is coupled to a touch potential control terminal, the output terminal of the shift register sub-circuit, the pull-up node, the pull-down node and a low level output terminal, respectively; and the touch potential control circuit is configured to, under control of the touch potential control terminal in a touch phase, control each of the pull-up node and the pull-down node to be coupled to the low level output terminal.

In one embodiment, the touch potential control circuit is further configured to, under control of the touch potential control terminal in the touch phase, control the output terminal of the shift register sub-circuit to be coupled to the low level output terminal.

In one embodiment, the touch potential control circuit includes: a first touch potential control transistor that includes a first electrode coupled to the touch potential control terminal, a second electrode coupled to the low level output terminal and a third electrode coupled to the output terminal of the shift register sub-circuit; a second touch potential control transistor that has a first electrode coupled to the touch potential control terminal, a second electrode coupled to the low level output terminal and a third electrode coupled to the pull-up node; and a third touch potential control transistor that includes a first electrode coupled to the touch potential control terminal, a second electrode coupled to the pull-down node and a third electrode coupled to the low level output terminal.

In one embodiment, each of the first touch potential control transistor, the second touch potential control transistor and the third touch potential control transistor is an n-type transistor, and the touch potential control terminal is configured to output a high level in the touch phase and output a low level in a display phase.

In one embodiment, each of the first touch potential control transistor, the second touch potential control transistor and the third touch potential control transistor is a p-type transistor, and the touch potential control terminal is configured to output a low level in the touch phase and output a high level in a display phase.

In one embodiment, the pull-up node control circuit includes a first pull-up node control sub-circuit and a second pull-up node control sub-circuit. The first pull-up node control sub-circuit is coupled to a first scan control terminal, a second scan control terminal, a first scan level terminal, a second scan level terminal and the pull-up node, respectively. The second pull-up node control sub-circuit is coupled to the pull-up node, the pull-down node and the low level output terminal, respectively.

In one embodiment, the output circuit is further coupled to the first clock signal output terminal and the low level output terminal, respectively; the pull-down node control circuit includes a first pull-down node control sub-circuit and a second pull-down node control sub-circuit; the first pull-down node control sub-circuit is coupled to the first scan level terminal, the second scan level terminal, a second clock signal output terminal, a third clock signal output terminal, a high level output terminal, the pull-down node and a pull-down control node, respectively; and the second pull-down node control sub-circuit is coupled to the pull-up node, the pull-down node and the low level output terminal, respectively.

In one embodiment, the output circuit is configured to, when a potential at the pull-up node is the high level, control the output terminal of the shift register sub-circuit to be coupled to the first clock signal output terminal; when a potential at the pull-down node is the high level, control the output terminal of the shift register sub-circuit to be coupled to the low level output terminal; the second pull-down node control sub-circuit is configured to, when the potential at the pull-up node is the high level, control the pull-down node to be coupled to the low level output terminal; and the second pull-up node control sub-circuit is configured to, when the potential at the pull-down node is the high level, control the pull-up node to be coupled to the low level output terminal.

In one embodiment, the first pull-down node control sub-circuit includes: a first pull-down node control transistor that includes a first electrode coupled to the first scan level terminal, a second electrode coupled to the second clock signal output terminal and a third electrode coupled to the pull-down control node; a second pull-down node control transistor that includes a first electrode coupled to the second scan level terminal, a second electrode coupled to the pull-down control node and a third electrode coupled to the third clock signal output terminal; and a third pull-down node control transistor that includes a first electrode coupled to the pull-down control node, a second electrode coupled to the high level output terminal and a third electrode coupled to pull-down node.

In one embodiment, the second pull-down node control sub-circuit includes a fourth pull-down node control transistor and a pull-down node control capacitor; the fourth pull-down node control transistor includes a first electrode coupled to the pull-up node, a second electrode coupled to the pull-down node and a third node coupled to the low level output terminal; and the pull-down node control capacitor includes a first end coupled to the low level output terminal and a second end coupled to the pull-down node.

In one embodiment, the output circuit includes: a first pull-up transistor that includes a first electrode coupled to the high level output terminal and a second electrode coupled to the pull-up node; a second pull-up transistor that includes a first electrode coupled to a third electrode of the first pull-up transistor, a second electrode coupled to the output terminal of the shift register sub-circuit, and a third electrode coupled to the clock signal output terminal; and a pull-down transistor that includes a first electrode coupled to the pull-down node, a second electrode coupled to the low level output terminal and a third electrode coupled to the output terminal of the shift register sub-circuit.

In one embodiment, when scanning in a forwarding direction, the first scan control terminal is an input terminal, the second scan control terminal is a reset terminal, the first scan level terminal is a high level terminal, and the second scan level terminal is a low level output terminal; when scanning in a reverse direction, the first scan control terminal is the reset terminal, the second scan control terminal is the input terminal, the first scan level terminal is the low level output terminal, and the second scan level terminal is the high level output terminal. The first pull-up node control sub-circuit is configured to, under control of the input terminal in an input phase, control the potential at the pull-up node to be the high level; and under control of the reset terminal in a reset phase, control the potential at the pull-up node to be the low level.

In one embodiment, the first pull-up node control sub-circuit includes: a first scan transistor that includes a first electrode coupled to the first scan control terminal, a second electrode coupled to the first scan level terminal, and a third electrode coupled to the pull-up node; and a second scan transistor that includes a first electrode coupled to the second scan control terminal, a second electrode coupled to the pull-up node, and a third electrode coupled to the second scan level terminal.

In one embodiment, the second pull-up node control sub-circuit includes a pull-up node control transistor. The pull-up node control transistor includes a first electrode coupled to the pull-down node, a second electrode coupled to the low level output terminal and a third electrode coupled to the pull-up node.

In one embodiment, the shift register circuit further includes a charge-discharge circuit. The charge-discharge circuit is coupled to the pull-up node and the output terminal of the shift register sub-circuit, respectively.

In one embodiment, the charge-discharge circuit includes a storage capacitor, and the storage capacitor includes a first end coupled to the pull-up node and a second end coupled to the output terminal of the shift register sub-circuit.

One embodiment of the present disclosure further provides a GOA circuit including a plurality of cascaded above shift register circuits.

One embodiment of the present disclosure further provides a display device including the above GOA circuit.

One embodiment of the present disclosure further provides a method for driving the above display device including: in a touch phase, controlling, by the touch potential control circuit under control of the touch potential control terminal, each of the pull-up node and the pull-down node to be coupled to the low level output terminal.

In one embodiment, the method further includes: in the touch phase, controlling, by the touch potential control circuit under control of the touch potential control terminal, the output terminal of the shift register sub-circuit to be coupled to the low level output terminal.

DETAILED DESCRIPTION

The technical solutions of embodiments of the present disclosure will be described hereinafter in a clear and complete manner in conjunction with the drawings of the embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Transistors adopted in all embodiments of the present disclosure may be thin film transistors, field effect transistor or other devices with the same or similar characteristics. In some embodiments of the present disclosure, a gate electrode may be referred as a first electrode; in order to distinguish another two electrodes of one transistor except for the gate electrode, another two electrodes may be referred as a second electrode and a third electrode, respectively. In actual application, the second electrode may be a drain electrode, and the third electrode may be a source electrode; or, the second electrode may be a source electrode, and the third electrode may be a drain electrode.

Figure 1:
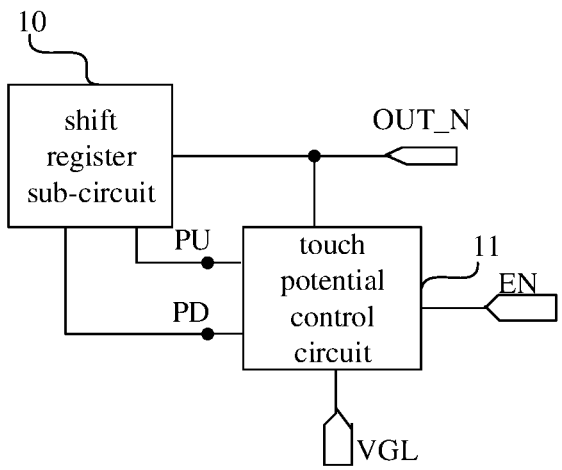
FIG. 1 is a schematic diagram of a shift register circuit according to an embodiment of the present disclosure.

FIG. 1 is a schematic diagram of a shift register circuit according to an embodiment of the present disclosure. Referring to FIG. 1, the shift register circuit includes a shift register sub-circuit 10. An output terminal OUT_N of the shift register sub-circuit 10 is coupled to a gate driving signal line. The shift register sub-circuit includes a pull-up node PU, a pull-down node PD, a charge-discharge circuit, a pull-up node control circuit, a pull-down node control circuit and an output circuit. The pull-up node control circuit is coupled to the pull-up node PU. The pull-down node control circuit is coupled to the pull-up node and the pull-down node, respectively. The charge-discharge circuit is coupled to the pull-up node and the output terminal OUT_N of the shift register sub-circuit, respectively. The output circuit is coupled to the pull-up node, the pull-down node and the output terminal OUT_N of the shift register sub-circuit, respectively.

The shift register circuit further includes a touch potential control circuit 11. The touch potential control circuit 11 is coupled to a touch potential control terminal EN, the output terminal OUT_N of the shift register sub-circuit 10, the pull-up node PU, the pull-down node PD and a low level output terminal for outputting a low level VGL, respectively. The touch potential control circuit 11 is configured to, under control of the touch potential control terminal EN in a touch phase, control each of the output terminal OUT_N of the shift register sub-circuit 10, the pull-up node PU and the pull-down node PD to be coupled to the low level output terminal for outputting a low level VGL.

In the shift register sub-circuit of one embodiment of the present disclosure, in the touch phase, the touch potential control circuit 11 can pull down each of a gate driving signal output from the output terminal OUT_N of the shift register sub-circuit 10, a potential at the pull-up node PU and a potential at the pull-down node PD down to the low level. As a result, in the touch phase, a GOA circuit does not output the gate driving signal, and the shift register sub-circuit is not in a working state, thereby reducing an overall power consumption of the GOA circuit and a display panel including the GOA circuit, and then improving touch accuracy.

In order to improve the touch accuracy, it is needed to keep the gate driving signal at the low level in the touch phase. In other words, in the touch phase, the shift register circuit is in a locked state, i.e., the potentials at the pull-up node and the pull-down node is pulled down, thereby reducing the overall power consumption of a gate driving circuit (which includes multiple stages of shift register circuits) and the display panel.

Figure 2:
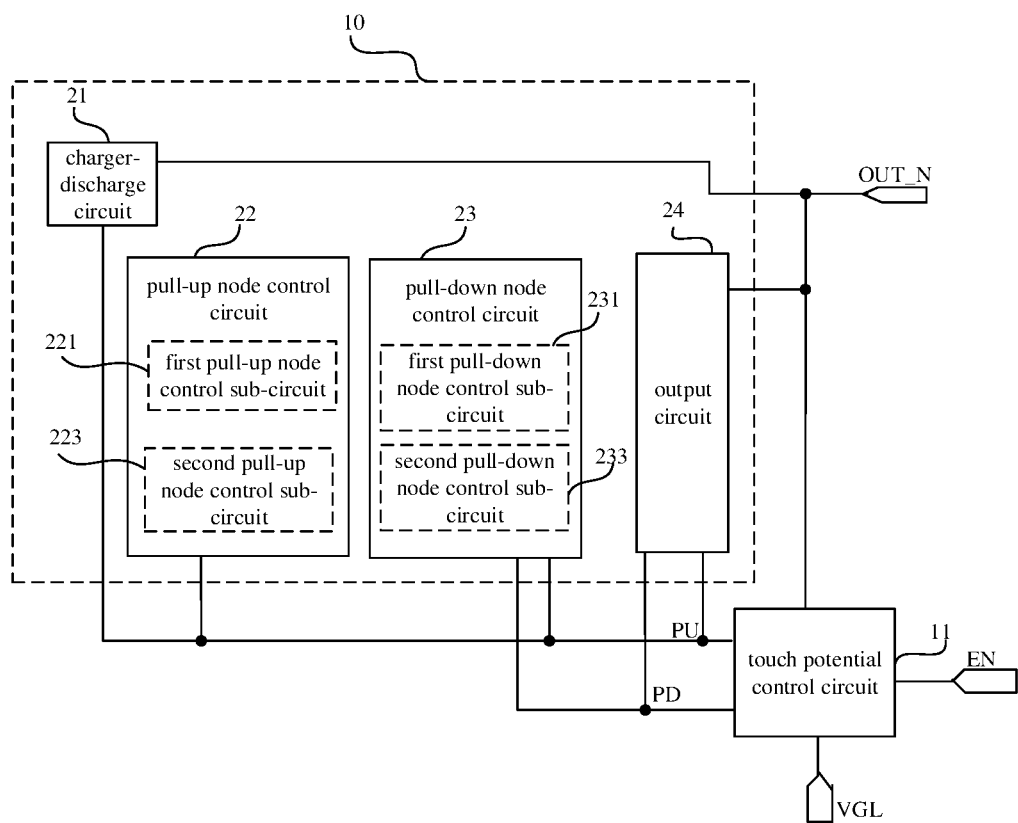
FIG. 2 is a schematic diagram of a shift register circuit according to another embodiment of the present disclosure.

As shown in FIG. 2, the shift register sub-circuit 10 includes a pull-up node PU, a pull-down node PD, a charger-discharge circuit 21, a pull-up node control circuit 22, a pull-down node control circuit 23 and an output circuit 24.

The pull-up node control circuit 22 is coupled to the pull-up node PU.

The pull-down node control circuit 23 is coupled to the pull-up node and the pull-down node, respectively.

The charge-discharge circuit 21 is coupled to the pull-up node and the output terminal OUT_N of the shift register sub-circuit, respectively.

The output circuit 24 is coupled to the pull-up node PU, the pull-down node PD and the output terminal OUT_N of the shift register sub-circuit, respectively.

The shift register circuit further includes a touch potential control circuit. Specifically, the touch potential control circuit may include a first touch potential control transistor, a second touch potential control transistor and a third touch potential control transistor.

A first electrode of the first touch potential control transistor is coupled to the touch potential control terminal. A second electrode of the first touch potential control transistor is coupled to the low level output terminal. A third electrode of the first touch potential control transistor is coupled to the output terminal of the shift register sub-circuit.

A first electrode of the second touch potential control transistor is coupled to the touch potential control terminal. A second electrode of the second touch potential control transistor is coupled to the low level output terminal. A third electrode of the second touch potential control transistor is coupled to the pull-up node.

A first electrode of the third touch potential control transistor is coupled to the touch potential control terminal. A second electrode of the third touch potential control transistor is coupled to the pull-down node. A third electrode of the third touch potential control transistor is coupled to the low level output terminal.

In actual application, each of the first touch potential control transistor, the second touch potential control transistor and the third touch potential control transistor may be an n-type transistor, and the touch potential control terminal is configured to output a high level in the touch phase and output a low level in a display phase. Or, each of the first touch potential control transistor, the second touch potential control transistor and the third touch potential control transistor may be a p-type transistor, and the touch potential control terminal is configured to output a low level in the touch phase and output a high level in the display phase.

In actual application, the first electrode may a gate electrode, the second electrode may be a source electrode, and the third electrode may be a drain electrode. Or, the first electrode may a gate electrode, the second electrode may be a drain electrode, and the third electrode may be a source electrode.

Figure 3:
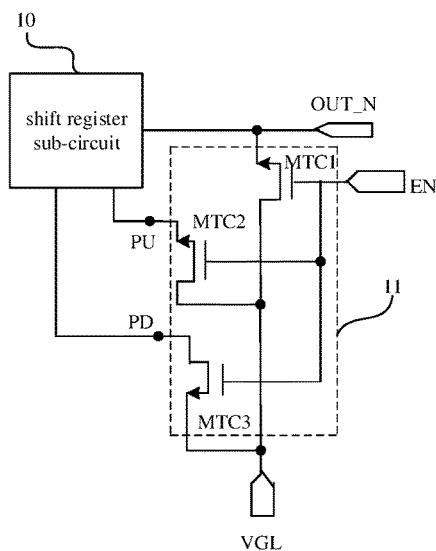
FIG. 3 is a schematic diagram of a shift register circuit according to still another embodiment of the present disclosure.

As shown in FIG. 3, in the shift register sub-circuit of one embodiment of the present disclosure, the touch potential control circuit may include a first touch potential control transistor MTC1, a second touch potential control transistor MTC2 and a third touch potential control transistor MTC3.

A gate electrode of the first touch potential control transistor MTC1 is coupled to the touch potential control terminal EN. A source electrode of the first touch potential control transistor MTC1 is coupled to the low level output terminal for outputting the low level VGL. A drain electrode of the first touch potential control transistor MTC1 is coupled to the output terminal OUT_N of the shift register sub-circuit 10.

A gate electrode of the second touch potential control transistor MTC2 is coupled to the touch potential control terminal EN. A source electrode of the second touch potential control transistor MTC2 is coupled to the low level output terminal for outputting the low level VGL. A drain electrode of the second touch potential control transistor MTC2 is coupled to the pull-up node PU.

A gate electrode of the third touch potential control transistor MTC3 is coupled to the touch potential control terminal EN. A source electrode of the third touch potential control transistor MTC3 is coupled to the pull-down node PD. A drain electrode of the third touch potential control transistor MTC3 is coupled to the low level output terminal for outputting the low level VGL.

In actual application, in the touch phase, the touch potential control terminal EN outputs a high level, thereby enabling the MTC1, the MTC2 and the MTC3 to be turned on, and enabling the OUT_N, PU and PD to receive the low level VGL.

Specifically, the output circuit is coupled to the pull-up node, the pull-down node, a first clock signal output terminal, the low level output terminal and the output terminal of the shift register sub-circuit, respectively.

A first terminal of the charge-discharge circuit is coupled to the pull-up node, and a second terminal of the charge-discharge circuit is coupled to the output terminal of the shift register sub-circuit.

The pull-up node control circuit includes a first pull-up node control sub-circuit and a second pull-up node control sub-circuit. The pull-down node control circuit includes a first pull-down node control sub-circuit and a second pull-down node control sub-circuit.

The first pull-up node control sub-circuit is coupled to a first scan control terminal, a second scan control terminal, a first scan level terminal, a second scan level terminal and the pull-up node, respectively.

The second pull-up node control sub-circuit is coupled to the pull-up node, the pull-down node and the low level output terminal, respectively.

The first pull-down node control sub-circuit is coupled to the first scan level terminal, the second scan level terminal, a second clock signal output terminal, a third clock signal output terminal, a high level output terminal for outputting a high level, the pull-down node and a pull-down control node, respectively. The first pull-down node control sub-circuit is configured to, when scanning in a forwarding direction, control the pull-down control node to be coupled to the second clock signal output terminal under control of the first scan level terminal, and control the pull-down node to be coupled to the high level output terminal when the second clock signal output terminal outputs a high level; when scanning in a reverse direction, control the pull-down control node to be coupled to the third clock signal output terminal under control of the second scan level terminal, and control the pull-down node to be coupled to the high level output terminal when the third clock signal output terminal outputs a high level.

The second pull-down node control sub-circuit is coupled to the pull-up node, the pull-down node and the low level output terminal, respectively.

Specifically, the first pull-down node control sub-circuit may include: a first pull-down node control transistor, which has a first electrode coupled to the first scan level terminal, a second electrode coupled to the second clock signal output terminal, and a third electrode coupled to the pull-down control node; a second pull-down node control transistor, which has a first electrode coupled to the second scan level terminal, a second electrode coupled to the pull-down control node, and a third electrode coupled to the third clock signal output terminal; and a third pull-down node control transistor, which has a first electrode coupled to the pull-down control node, a second electrode coupled to the high level output terminal, and a third electrode coupled to pull-down node.

In actual application, when scanning in the forwarding direction, the first scan control terminal is an input terminal, the second scan control terminal is a reset terminal, the first scan level terminal is a high level terminal, and the second scan level terminal is a low level output terminal; when scanning in the reverse direction, the first scan control terminal is the reset terminal, the second scan control terminal is the input terminal, the first scan level terminal is the low level output terminal, and the second scan level terminal is the high level output terminal.

The first pull-up node control sub-circuit is configured to, under control of the input terminal in an input phase, control the potential at the pull-up node to be the high level; and under control of the reset terminal in a reset phase, control the potential at the pull-up node to be the low level.

Specifically, the first pull-up node control sub-circuit may include: a first scan transistor which has a first electrode coupled to the first scan control terminal, a second electrode coupled to the first scan level terminal, and a third electrode coupled to the pull-up node; and a second scan transistor which has a first electrode coupled to the second scan control terminal, a second electrode coupled to the pull-up node, and a third electrode coupled to the second scan level terminal.

Specifically, the output circuit is configured to, when the potential at the pull-up node is the high level, control the output terminal of the shift register sub-circuit to be coupled to the first clock signal output terminal; when the potential at the pull-down node is the high level, control the output terminal of the shift register sub-circuit to be coupled to the low level output terminal.

The second pull-down node control sub-circuit is configured to, when the potential at the pull-up node is the high level, control the pull-down node to be coupled to the low level output terminal.

The second pull-up node control sub-circuit is configured to, when the potential at the pull-down node is the high level, control the pull-up node to be coupled to the low level output terminal.

Specifically, the output circuit may include: a first pull-up transistor which has a first electrode coupled to the high level output terminal, and a second electrode coupled to the pull-up node; a second pull-up transistor which has a first electrode coupled to a third electrode of the first pull-up transistor, a second electrode coupled to the output terminal of the shift register sub-circuit, and a third electrode coupled to the clock signal output terminal; and a pull-down transistor which has a first electrode coupled to the pull-down node, a second electrode coupled to the low level output terminal and a third electrode coupled to the output terminal of the shift register sub-circuit.

The second pull-down node control sub-circuit may include: a fourth pull-down node control transistor which has a first electrode coupled to the pull-up node, a second electrode coupled to the pull-down node, and a third node coupled to the low level output terminal; and a pull-down node control capacitor which has a first end coupled to the low level output terminal and a second end coupled to the pull-down node.

The second pull-up node control sub-circuit may include: a pull-up node control transistor which has a first electrode coupled to the pull-down node, a second electrode coupled to the low level output terminal and a third electrode coupled to the pull-up node.

The charge-discharge circuit may include a storage capacitor which has a first end coupled to the pull-up node and a second end coupled to the output terminal of the shift register sub-circuit.

The shift register circuit of one embodiment of the present disclosure will be described hereinafter with an example.

Figure 4:
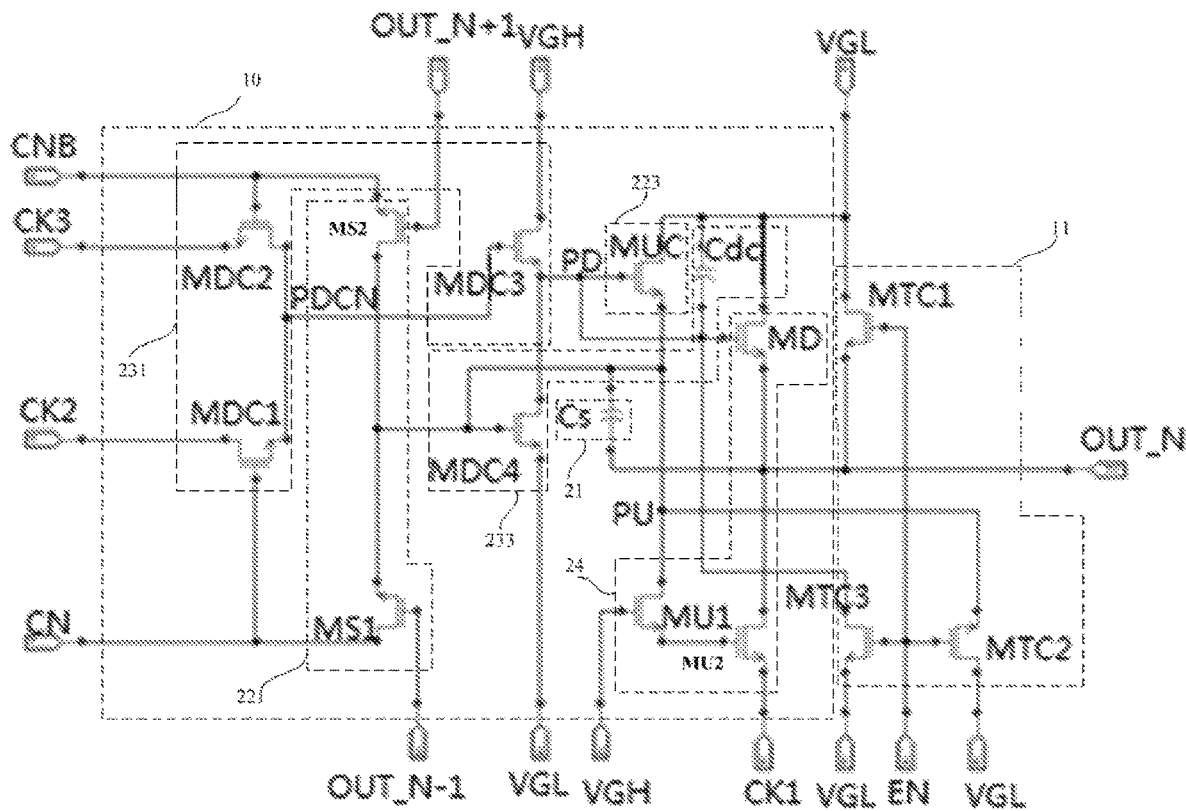
FIG. 4 is a circuit diagram of a shift register circuit according to an embodiment of the present disclosure.

As shown in FIG. 2 and FIG. 4, a shift register circuit of one embodiment of the present disclosure includes a shift register sub-circuit 10 and a touch potential control circuit 11.

The touch potential control circuit 11 includes: a first touch potential control transistor MTC1, a second touch potential control transistor MTC2 and a third touch potential control transistor MTC3.

A gate electrode of the first touch potential control transistor MTC1 is coupled to the touch potential control terminal EN. A source electrode of the first touch potential control transistor MTC1 is coupled to the low level output terminal for outputting the low level VGL. A drain electrode of the first touch potential control transistor MTC1 is coupled to the output terminal OUT_N of the shift register sub-circuit.

A gate electrode of the second touch potential control transistor MTC2 is coupled to the touch potential control terminal EN. A source electrode of the second touch potential control transistor MTC2 is coupled to the low level output terminal for outputting the low level VGL. A drain electrode of the second touch potential control transistor MTC2 is coupled to the pull-up node PU.

A gate electrode of the third touch potential control transistor MTC3 is coupled to the touch potential control terminal EN. A source electrode of the third touch potential control transistor MTC3 is coupled to the pull-down node PD. A drain electrode of the third touch potential control transistor MTC3 is coupled to the low level output terminal for outputting the low level VGL.

As shown in FIG. 2 and FIG. 4, the shift register sub-circuit 10 includes a pull-up node PU, a pull-down node PD, a charger-discharge circuit 21, a pull-up node control circuit 22, a pull-down node control circuit 23 and an output circuit 24. The pull-up node control circuit 22 includes a first pull-up node control sub-circuit 221 and a second pull-up node control sub-circuit 223. The pull-down node control circuit 23 includes a first pull-down node control sub-circuit 231 and a second pull-down node control sub-circuit 233.

As shown in FIG. 4, the first pull-down node control sub-circuit 231 includes: a first pull-down node control transistor MDC1, a second pull-down node control transistor MDC2 and a third pull-down node control transistor MDC3.

A gate electrode of the first pull-down node control transistor MDC1 is coupled to the first scan level terminal CN. A source electrode of the first pull-down node control transistor MDC1 is coupled to the second clock signal output terminal CK2. A drain electrode of the first pull-down node control transistor MDC1 is coupled to the pull-down control node PDCN.

A gate electrode of the second pull-down node control transistor MDC2 is coupled to the second scan level terminal CNB. A source electrode of the second pull-down node control transistor MDC2 is coupled to the pull-down control node PDCN. A drain electrode of the second pull-down node control transistor MDC2 is coupled to the third clock signal output terminal CK3.

A gate electrode of the third pull-down node control transistor MDC3 is coupled to the pull-down control node PDCN. A source electrode of the third pull-down node control transistor MDC3 is coupled to the high level output terminal for outputting the high level VGH. A drain electrode of the third pull-down node control transistor MDC3 is coupled to pull-down node PD.

The first pull-up node control sub-circuit 221 includes: a first scan transistor MS1 and a second scan transistor MS2.

A gate electrode of the first scan transistor MS1 is coupled to an output terminal OUT_N−1. A source electrode of the first scan transistor MS1 is coupled to the first scan level terminal CN. A drain electrode of the first scan transistor MS1 is coupled to the pull-up node PU.

A gate electrode of the second scan transistor MS2 is coupled to a reset terminal OUT_N+1. A source electrode of the second scan transistor MS2 is coupled to the pull-up node PU. A drain electrode of the second scan transistor MS2 is coupled to the second scan level terminal CNB.

The output circuit 24 includes: a first pull-up transistor MU1, a second pull-up transistor MU2 and a pull-down transistor MD.

A gate electrode of the first pull-up transistor MU1 is coupled to the high level output terminal for outputting the high level VGH. A source electrode of the first pull-up transistor MU1 is coupled to the pull-up node PU.

A gate electrode of the second pull-up transistor MU2 is coupled to a drain electrode of the first pull-up transistor MU1. A source electrode of the second pull-up transistor MU2 is coupled to the output terminal OUT_N of the shift register sub-circuit. A drain electrode of the second pull-up transistor MU2 is coupled to the clock signal output terminal CK1.

A gate electrode of the pull-down transistor MD is coupled to the pull-down node PD. A source electrode of the pull-down transistor MD is coupled to the low level output terminal for outputting the low level VGL. A drain electrode of the pull-down transistor MD is coupled to the output terminal OUT_N of the shift register sub-circuit.

The second pull-down node control sub-circuit 233 includes: a fourth pull-down node control transistor MDC4 and a pull-down node control capacitor Cdc. A gate electrode of the fourth pull-down node control transistor MDC4 is coupled to the pull-up node PU. A source electrode of the fourth pull-down node control transistor MDC4 is coupled to the pull-down node PD. A drain electrode of the fourth pull-down node control transistor MDC4 is coupled to the low level output terminal for outputting the low level VGL.

A first end of the pull-down node control capacitor Cdc is coupled to the low level output terminal for outputting the low level VGL. A second end of the pull-down node control capacitor Cdc is coupled to the pull-down node PD.

The second pull-up node control sub-circuit 223 includes a pull-up node control transistor MUC. A gate electrode of the pull-up node control transistor MUC is coupled to the pull-down node PD. A source electrode of the pull-up node control transistor MUC is coupled to the low level output terminal for outputting the low level VGL. A drain electrode of the pull-up node control transistor MUC is coupled to the pull-up node PU.

The charge-discharge circuit 21 includes a storage capacitor Cs. The storage capacitor Cs has a first end coupled to the pull-up node PU and a second end coupled to the output terminal OUT_N of the shift register sub-circuit.

In the shift register circuit of one embodiment of the present disclosure, as shown in FIG. 4, the first scan level terminal CN outputs the high level, and the second scan level terminal CNB outputs the low level.

Figure 5:
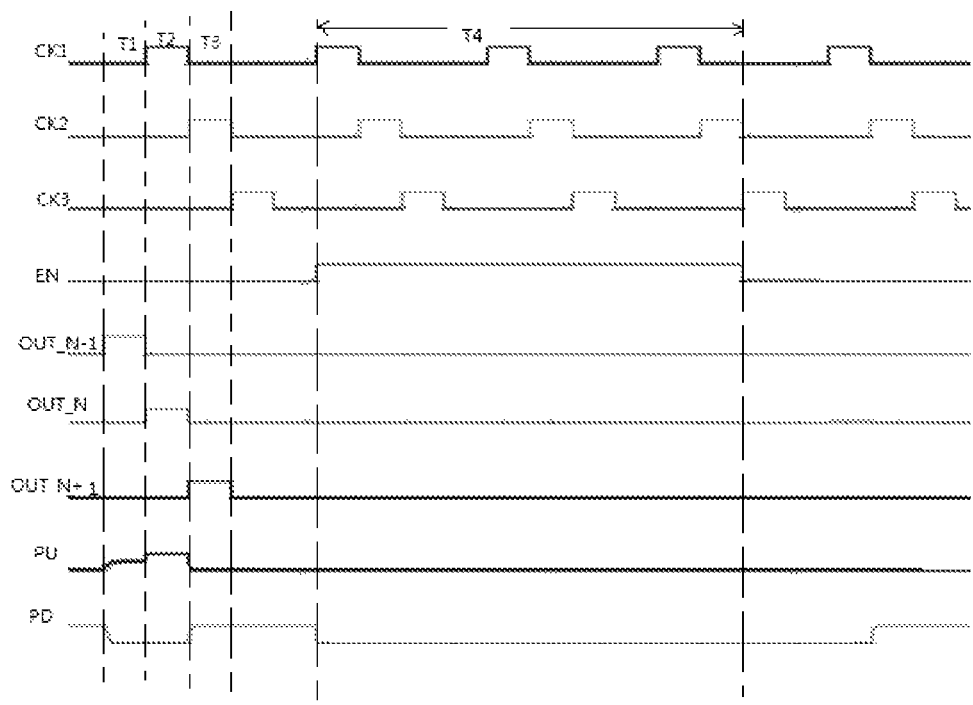
FIG. 5 is a timing sequence diagram of the shift register circuit shown in FIG. 4.

FIG. 5 is a timing sequence diagram of the shift register circuit shown in FIG. 4. As shown in FIG. 5, in a first phase T1, i.e., an input phase, the output terminal OUT_N−1 outputs the high level, the first scan transistor MS1 is turned on, the potential at the pull-up node PU rises, the fourth pull-down node control transistor MDC4 is turned on, the potential at the pull-down node PD is pulled down, and the storage capacitor Cs is charged.

In a second phase T2, i.e., an output phase, the first scan transistor MS1 is turned off, the potential at the pull-up node PU continuously rises due to bootstrap effect of the storage capacitor Cs, the second pull-up transistor MU2 is turned on, the output terminal OUT_N of the shift register sub-circuit outputs the high level, the potential at the pull-down node PD is still pulled down In a third phase T3, i.e., a reset phase, the second scan transistor MS2 is turned on, the potential at the pull-up node PU is still pulled down, since the second clock signal output terminal CK2 outputs the high level, the potential at the pull-down control node PDCN is the high level, the third pull-down node control transistor MDC3 is turned on, the potential at the pull-down node PD is pulled up, both of the fourth pull-down node control transistor MDC4 and the pull-down transistor MD are turned on, the potential at the pull-up node PU and the gate driving signal output from the output terminal OUT_N of the shift register sub-circuit are pulled down, and the pull-down node control capacitor Cdc is charged.

In a fourth phase T4, i.e., a touch phase, the touch potential control terminal EN outputs a high level, each of the first touch potential control transistor MTC1, the second touch potential control transistor MTC2 and the third touch potential control transistor MTC3 is turned on, and each of the gate driving signal output from the output terminal OUT_N of the shift register sub-circuit, the potential at the pull-up node PU and the potential at the pull-down node PD is pulled down. This can not only improve touch sensitivity, but also reduce power consumption of the display panel.

A GOA circuit of one embodiment of the present disclosure includes multiple cascaded shift register circuits described above.

A display device of one embodiment of the present disclosure includes the above gate driving circuit.

Preferred embodiments of the present disclosure are described hereinabove. It should be noted that the ordinary skilled in the art can make various improvements and replacements without departing from the principle of the disclosure, and those improvements and replacements all fall within the protection scope of the present disclosure.

What is claimed is:

1. A shift register circuit comprising: a shift register sub-circuit with an output terminal coupled to a gate driving signal line;
    wherein the shift register sub-circuit includes a pull-up node, a pull-down node, a pull-up node control circuit, a pull-down node control circuit and an output circuit; the pull-up node control circuit is coupled to the pull-up node; the pull-down node control circuit is coupled to the pull-up node and the pull-down node, respectively; and the output circuit is coupled to the pull-up node, the pull-down node and the output terminal of the shift register sub-circuit, respectively; and
    wherein the shift register circuit further includes a touch potential control circuit; and the touch potential control circuit is coupled to a touch potential control terminal, the output terminal of the shift register sub-circuit, the pull-up node, the pull-down node and a low level output terminal, respectively; and the touch potential control circuit is configured to, under control of the touch potential control terminal in a touch phase, control each of the pull-up node and the pull-down node to be coupled to the low level output terminal;
    wherein the pull-up node control circuit includes a first pull-up node control sub-circuit and a second pull-up node control sub-circuit;
    wherein the first pull-up node control sub-circuit is coupled to a first scan control terminal, a second scan control terminal, a first scan level terminal, a second scan level terminal and the pull-up node, respectively; and
    wherein the second node control sub-circuit is coupled to the pull-up node, the pull-down node and the low level output terminal, respectively;
    wherein the output circuit is further coupled to a first clock signal output terminal and the low level output terminal, respectively;
    wherein the pull-down node control circuit includes a first pull-down node control sub-circuit and a second pull-down node control sub-circuit;
    wherein the first pull-down node control sub-circuit is coupled to the first scan level terminal, the second scan level terminal, second clock terminal output terminal, a third clock signal output terminal, a high output terminal, the pull-down node and a pull-down control node, respectively; and
    wherein the second pull-down node control sub-circuit is coupled to the pull-up node, the pull-down node and the low level output terminal, respectively;
    wherein the output circuit is configured to, when a potential at the pull-up node is the high level, control the output terminal of the shift register sub-circuit to be coupled to the first clock signal output terminal; when a potential at the pull-down node is the high level, control the output terminal of the shift register sub-circuit to be coupled to the low level output terminal;
    wherein the second pull-down node control sub-circuit is configured to, when the potential at the pull-up node is the high level, control the pull-down node to be coupled to the low level output terminal; and
    wherein the second pull-up node control sub-circuit is configured to, when the potential at the pull-down node is the high level, control the pull-up node to be coupled to the low level output terminal.

2. The shift register circuit of claim 1, wherein the touch potential control circuit is further configured to, under control of the touch potential control terminal in the touch phase, control the output terminal of the shift register sub-circuit to be coupled to the low level output terminal.

3. The shift register circuit of claim 1, wherein the touch potential control circuit includes:
    a first touch potential control transistor that includes a first electrode coupled to the touch potential control terminal, a second electrode coupled to the low level output terminal and a third electrode coupled to the output terminal of the shift register sub-circuit;
    a second touch potential control transistor that has a first electrode coupled to the touch potential control terminal, a second electrode coupled to the low level output terminal and a third electrode coupled to the pull-up node; and
    a third touch potential control transistor that includes a first electrode coupled to the touch potential control terminal, a second electrode coupled to the pull-down node and a third electrode coupled to the low level output terminal.

4. The shift register circuit of claim 3, wherein each of the first touch potential control transistor, the second touch potential control transistor and the third touch potential control transistor is an n-type transistor, and the touch potential control terminal is configured to output a high level in the touch phase and output a low level in a display phase.

5. The shift register circuit of claim 3, wherein each of the first touch potential control transistor, the second touch potential control transistor and the third touch potential control transistor is a p-type transistor, and the touch potential control terminal is configured to output a low level in the touch phase and output a high level in a display phase.

6. The shift register circuit of claim 1, wherein the first pull-down node control sub-circuit includes:
    a first pull-down node control transistor that includes a first electrode coupled to the first scan level terminal, a second electrode coupled to the second clock signal output terminal and a third electrode coupled to the pull-down control node;
    a second pull-down node control transistor that includes a first electrode coupled to the second scan level terminal, a second electrode coupled to the pull-down control node and a third electrode coupled to the third clock signal output terminal; and a third pull-down node control transistor that includes a first electrode coupled to the pull-down control node, a second electrode coupled to the high level output terminal and a third electrode coupled to pull-down node.

7. The shift register circuit of claim 6, wherein the second pull-down node control sub-circuit includes a fourth pull-down node control transistor and a pull-down node control capacitor;
wherein the fourth pull-down node control transistor includes a first electrode coupled to the pull-up node, a second electrode coupled to the pull-down node and a third node coupled to the low level output terminal; and
wherein the pull-down node control capacitor includes a first end coupled to the low level output terminal and a second end coupled to the pull-down node.

8. The shift register circuit of claim 1, wherein the output circuit includes:
a first pull-up transistor that includes a first electrode coupled to the high level output terminal and a second electrode coupled to the pull-up node;
a second pull-up transistor that includes a first electrode coupled to a third electrode of the first pull-up transistor, a second electrode coupled to the output terminal of the shift register sub-circuit, and a third electrode coupled to the first clock signal output terminal; and
a pull-down transistor that includes a first electrode coupled to the pull-down node, a second electrode coupled to the low level output terminal and a third electrode coupled to the output terminal of the shift register sub-circuit.

9. The shift register circuit of claim 1, wherein when scanning in a forwarding direction, the first scan control terminal is an input terminal, the second scan control terminal is a reset terminal, the first scan level terminal is a high level terminal, and the second scan level terminal is a low level output terminal; when scanning in a reverse direction, the first scan control terminal is the reset terminal, the second scan control terminal is the input terminal, the first scan level terminal is the low level output terminal, and the second scan level terminal is the high level output terminal; and
wherein the first pull-up node control sub-circuit is configured to, under control of the input terminal in an input phase, control the potential at the pull-up node to be the high level; and under control of the reset terminal in a reset phase, control the potential at the pull-up node to be the low level.

10. The shift register circuit of claim 9, wherein the first pull-up node control sub-circuit includes:
a first scan transistor that includes a first electrode coupled to the first scan control terminal, a second electrode coupled to the first scan level terminal, and a third electrode coupled to the pull-up node; and
a second scan transistor that includes a first electrode coupled to the second scan control terminal, a second electrode coupled to the pull-up node, and a third electrode coupled to the second scan level terminal.

11. The shift register circuit of claim 1, wherein the second pull-up node control sub-circuit includes a pull-up node control transistor; and
wherein the pull-up node control transistor includes a first electrode coupled to the pull-down node, a second electrode coupled to the low level output terminal and a third electrode coupled to the pull-up node.

12. The shift register circuit of claim 1, further comprising a charge-discharge circuit;
wherein the charge-discharge circuit is coupled to the pull-up node and the output terminal of the shift register sub-circuit, respectively.

13. The shift register circuit of claim 12, wherein the charge-discharge circuit includes a storage capacitor, and the storage capacitor includes a first end coupled to the pull-up node and a second end coupled to the output terminal of the shift register sub-circuit.

14. A GOA circuit comprising a plurality of cascaded shift register circuits of claim 1.

15. A display device comprising the GOA circuit of claim 14.

16. A method for driving the display device of claim 15, comprising:
in a touch phase, controlling, by the touch potential control circuit under control of the touch potential control terminal, each of the pull-up node and the pull-down node to be coupled to the low level output terminal.

17. The method of claim 16, further comprising:
in the touch phase, controlling, by the touch potential control circuit under control of the touch potential control terminal, the output terminal of the shift register sub-circuit to be coupled to the low level output terminal.

* * * * *